(12) United States Patent
Zlatanovici

(10) Patent No.: US 9,071,238 B2
(45) Date of Patent: Jun. 30, 2015

(54) CONTENTION-FREE LEVEL CONVERTING FLIP-FLOPS FOR LOW-SWING CLOCKING

(75) Inventor: Radu Zlatanovici, Oakland, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 921 days.

(21) Appl. No.: 12/335,481

(22) Filed: Dec. 15, 2008

(65) Prior Publication Data

US 2010/0148836 A1 Jun. 17, 2010

(51) Int. Cl.
*H03K 3/00* (2006.01)
*H03K 3/356* (2006.01)
*G06F 17/50* (2006.01)

(52) U.S. Cl.
CPC ........ *H03K 3/356165* (2013.01); *G06F 17/505* (2013.01)

(58) Field of Classification Search
CPC . H03K 3/012; H03K 3/35625; H03K 3/0375; H03K 3/356156; H03K 3/0372
See application file for complete search history.

(56) References Cited

U.S. PATENT DOCUMENTS

| | | | |
|---|---|---|---|
| 5,453,706 A | | 9/1995 | Yee |
| 5,694,061 A | * | 12/1997 | Morosawa et al. ............ 326/119 |
| 6,002,284 A | * | 12/1999 | Hill et al. ...................... 327/202 |
| 6,081,153 A | * | 6/2000 | Hamada et al. ................ 327/333 |
| 6,198,323 B1 | * | 3/2001 | Offord .......................... 327/202 |
| 6,737,900 B1 | * | 5/2004 | Wu ................................ 327/218 |
| 7,164,302 B1 | * | 1/2007 | Elkin ............................ 327/208 |
| 7,183,825 B2 | * | 2/2007 | Padhye et al. ................. 327/202 |
| 7,629,815 B1 | * | 12/2009 | Tang et al. .................... 326/121 |
| 7,710,155 B2 | * | 5/2010 | Bhatia et al. .................... 326/93 |
| 7,746,137 B2 | * | 6/2010 | Saint-Laurent et al. ...... 327/200 |
| 7,868,677 B2 | * | 1/2011 | Jain .............................. 327/202 |
| 2007/0188211 A1 | * | 8/2007 | Kim ............................. 327/291 |
| 2008/0218234 A1 | | 9/2008 | Jain |

FOREIGN PATENT DOCUMENTS

EP 0106557 4/1984

OTHER PUBLICATIONS

International Search Report dated Jul. 26, 2010 for PCT/US2009/067351.
Written Opinion dated Jul. 26, 2010 for PCT/US2009/067351.
Usami, K. et al., Automated low-power technique exploiting multiple supply voltages applied to a media processor, IEEE Journal of Solid-State Circuits, Mar. 1998, vol. 33, Issue 3, pp. 463-472.

(Continued)

*Primary Examiner* — Sibin Chen
(74) *Attorney, Agent, or Firm* — Vista IP Law Group, LLP

(57) ABSTRACT

The present invention includes a family of level converting flip-flops that accepts data and clock inputs at a lower voltage level while producing data outputs at a higher voltage level. These flip-flops enable fine-grained dual supply voltage techniques such as low-swing clocking (distributing the clock signal at a lower voltage level) and clustered voltage scaling (CVS). The level conversion is accomplished in a very efficient manner by sharing the positive feedbacks inside a flip-flop for both storage and level conversion. Additionally, the presented flip-flops are contention-free and non-ratioed, thus having reduced timing and power overheads due to the level conversion function.

23 Claims, 9 Drawing Sheets

(56) References Cited

OTHER PUBLICATIONS

Markovic, D. et al., Feasibility study of low-swing clocking, 24th International Conference on Microelectronics, May 2004, vol. 2, pp. 547-550.

Ishihara, F. et al., Level Conversion for Dual-Supply Systems, IEEE Transactions on Very Large Scale Integration (VLSI) Systems, Feb. 2004, vol. 12, Issue 2, pp. 185-195.

* cited by examiner

ABSTRACT# CONTENTION-FREE LEVEL CONVERTING FLIP-FLOPS FOR LOW-SWING CLOCKING

FIELD OF THE INVENTION

The invention generally relates in one or more of its embodiments to Integrated Circuit (IC) design.

BACKGROUND

In designing circuits, there are many different design strategies that may be implemented to obtain a desired result. For example, a design strategy for reducing power consumption of a circuit design may be considered. One way to implement such a strategy is by using multiple supply voltage (MSV) circuits. They save power by using lower supply voltages on non-critical paths and blocks. In MSV circuits, level conversion must be performed at the interface of blocks operating at different power supply voltages (different "levels").

A type of MSV is called Clustered Voltage Scaling (CVS) in which the supply voltage is lowered selectively on non-critical paths inside a block. In order to implement CVS, level conversion is done at the sequential elements of the circuit (i.e., flip-flops). The clock distribution network can also be implemented at a lower supply voltage (i.e., low-swing clocking) for significant additional power savings. In order to do low-swing clocking in addition to CVS, a double level-converting flip-flop is required: a flip-flop that takes both data and clock inputs at a lower voltage level and that produces data outputs at a higher voltage level.

The conventional implementation for a double level-converting flip-flop may have a regular flip-flop operating at lower supply voltage followed by a regular asynchronous level converter on the Q output. This approach is very slow and power-inefficient. An improvement includes combining the data storage function of a flip-flop with the level conversion function to form a single-level-converting flip-flop. The existing circuit designs introduce contention and are ratioed.

Conventional level converters are ratioed because their operation depends on the precise balancing of the driving strengths and sizes of the transistors in contention. The conventional designs, having contention and being ratioed, means that the ratios of the driving strengths and sizes of the devices in contention must be carefully chosen such that the contention has the desired outcome over all the process corners. Ratioed designs are inherently less robust than non-ratioed designs.

SUMMARY

The present invention presents a family of contention-free level converting flip-flops for low swing clocking. The design strategy removes the contentions and makes the design non-ratioed, and thus reduces the delay and power of the level converter and increases the circuit design's robustness.

In one embodiment, a level converting flip-flop includes a plurality of circuit elements configured such that the level converting flip-flop is contention-free, wherein the circuit elements are non-ratioed.

In another embodiment, the level converting flip-flop is used to build digital circuits that use low-swing clocking and clustered voltage scaling to reduce power.

In another embodiment, a method for synthesizing a circuit design that contains at least one level-converting flip-flop, including the acts of providing to a level converting flip-flop at least a data signal and a clock signal at a first swing voltage, wherein the level converting flip-flop has a plurality of circuit elements; performing level conversion and storage of a bit, wherein the flip-flop is contention free and the circuit elements are non-ratioed; outputting from the level converting flip-flop at least one output signal, wherein the output signal is at a second swing voltage; and storing a design data of the circuit design having the level converting flip-flop in a volatile or non-volatile computer usable medium.

In another embodiment, A computer program product embodied on a computer usable medium, the computer usable medium having stored thereon a circuit design block or a sequence of instructions which, when executed by a processor causes the processor to execute a process for synthesizing a circuit that contains at least one level-converting flip-flop, the process includes the act of providing the circuit design block having plurality of circuit elements configured such that the level converting flip-flop is contention-free, wherein the circuit elements are non-ratioed.

BRIEF DESCRIPTION OF THE DRAWINGS

Like reference numbers and designations in the various drawings indicate like elements.

DETAILED DESCRIPTION

The present invention includes a family of level converting flip-flops that may accept data and clock at a lower voltage level while producing data outputs at a higher voltage level. These flip-flops enable fine-grained dual supply voltage techniques such as low-swing clocking (distributing the clock signal at a lower voltage level) and clustered voltage scaling (CVS). The level conversion is accomplished by these flip-flops in a very efficient manner by sharing the positive feedbacks inside a flip-flop for both storage and level conversion. These flip-flops are contention-free and non-ratioed, thus having reduced timing and power overheads due to the level conversion function. Some embodiments of the present invention include level converters that are more robust to process variations and noise due to the fact that they are not ratioed.

In some embodiments, an approach of combining the level conversion function with the bit storage function in a flip-flop that takes the clock signal at a lower power supply voltage, thus enabling low-swing clocking and clustered voltage scaling. Some embodiments provide level conversion technique that does not have contention between fully on transistors. Some embodiments enable the level converters to consume less power (by not wasting power in resolving the contention) and to be faster (contentions take time to resolve).

In other embodiments, the technique provides circuit designs with low overhead level conversion for low-swing clocking and clustered voltage scaling, contention-free level conversion, and non-ratioed level conversion. In additional embodiments, other types of level converting flip-flops implemented with the technique are also described below.

Figure 1:
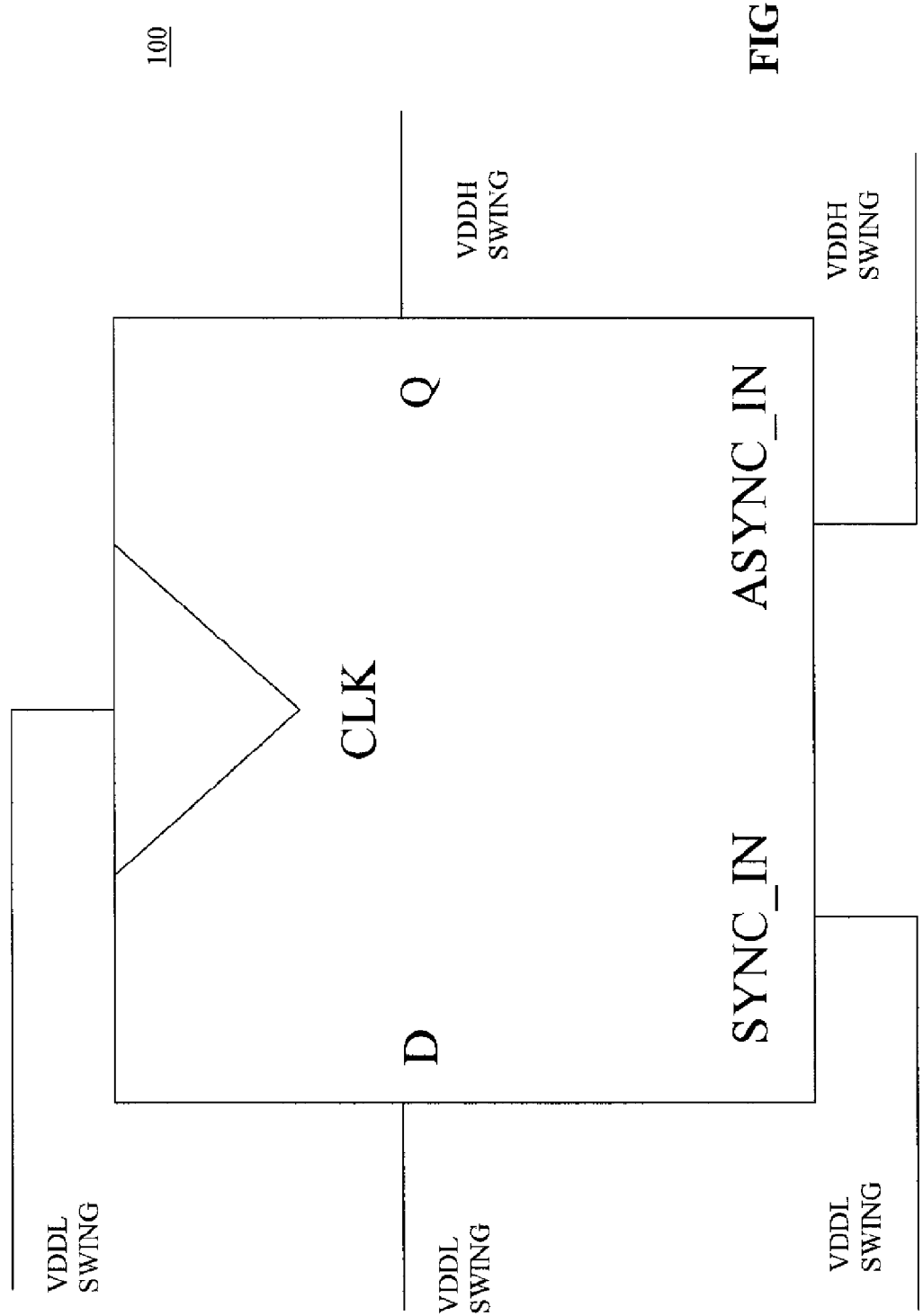
FIG. 1 depicts a diagram of a flip-flop block according to an embodiment of the invention.
Figure 2:
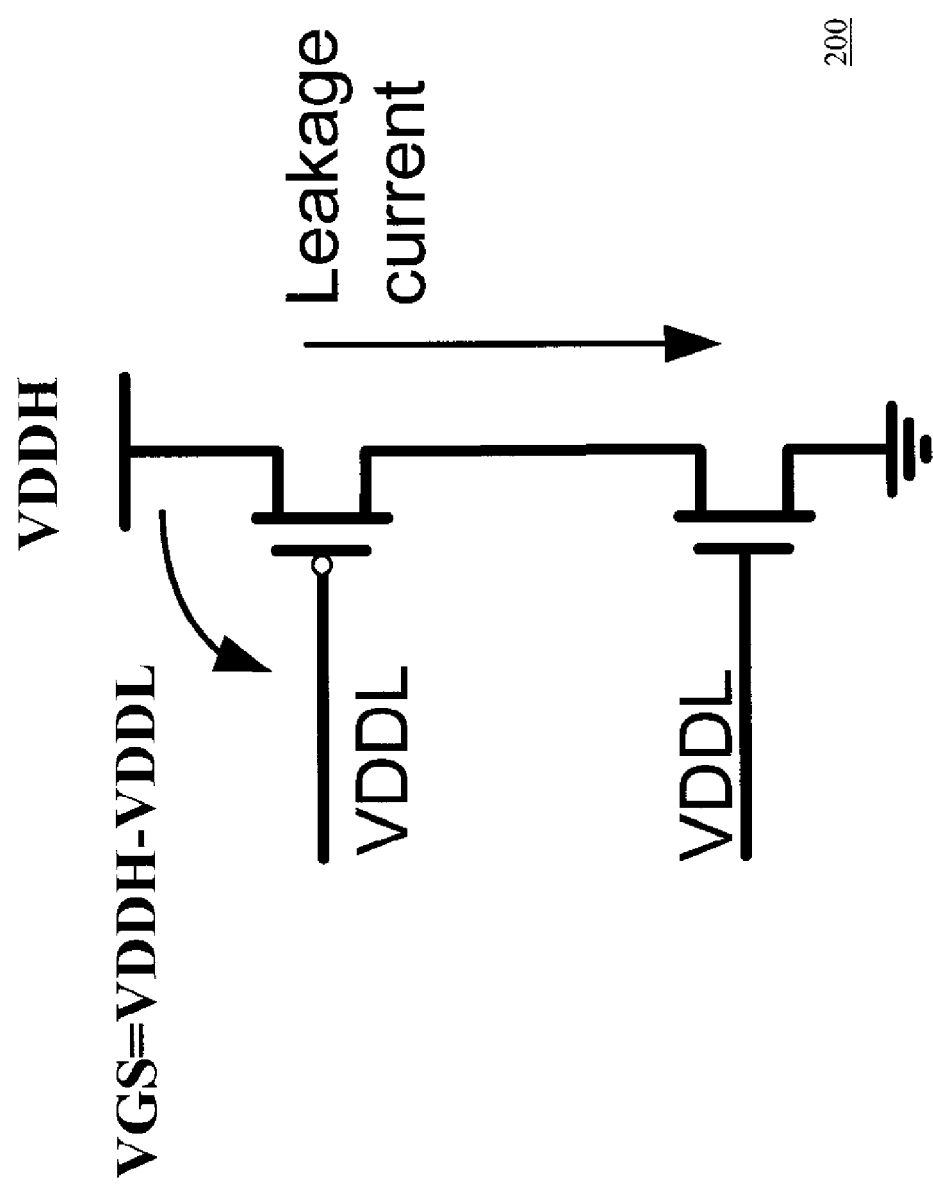
FIG. 2 illustrates a diagram showing a simplified logic circuit having reduced transient contention as the worst case that can happen according to an embodiment of the invention.

The family of non-ratioed contention-free level converting flip-flops includes flip-flops that have the function of level conversion as shown in FIG. 1 with the desirable properties of being non-ratioed and contention-free as described in FIG. 2. This family of flip-flops takes data and clock at lower voltage level and provides output Q at higher voltage level with the desirable property of being contention free and non-ratioed. In assisting in the description of the embodiments in the detailed description, the lower supply voltage at an interface is referred to as VDDL, and to the corresponding blocks, circuits, and devices operating at VDDL as "VDDL blocks", "VDDL circuits" and "VDDL devices". Similarly, the higher supply voltage at an interface is referred to as VDDH, and to the corresponding blocks, circuits, and devices operating at VDDH as "VDDH blocks", "VDDH circuits", and "VDDH devices". It is implicitly assumed that VDDL≤VDDH.

FIG. 1 depicts a diagram of a level converting flip-flop block 100 according to an embodiment of the invention. The block receives a VDDL signal to ports CLK, D, and other synchronous inputs labeled SYNC_IN. The block also may receive VDDH signals at asynchronous inputs such as the one labeled ASYNC_IN. The block outputs a VDDH signal at port Q.

In some embodiments, the level converting flip-flop 100 may be a D-type flip-flop, T-type flip-flop, JK-type flip-flop, D-type with synchronous set and/or reset and/or asynchronous set and/or enabled, etc. Any type of flip-flop that functions to store a bit may be used.

FIG. 2 illustrates the contention-free and non-ratioed properties of the flip-flops in FIG. 1 according to an embodiment. FIG. 2 includes a PMOS connected to a VDDH and a NMOS that is connected to ground. The gates of the PMOS and NMOS devices are held at VDDL. A VDDH PMOS device with VDDL on its gate is said to be in a "leaky off" state. In FIG. 2, the contention has been reduced as compared to the case where the gate of the PMOS is held at zero volts. This reduced contention allows a non-ratioed design. In other words, even a minimum size NMOS is much stronger when fully on than any reasonably sized PMOS in leaky off state, in all process corners.

FIG. 2 is an example of a circuit design 200 that illustrates the worst case transient contention that can happen between an NMOS device and a PMOS device in any embodiment of the invention. In the worst case and only for a limited time, a fully on NMOS device with VGS=VDDL can be in contention with a leaky off VDDH PMOS device with VDDL on its gate, hence |VGS|=VDDH-VDDL. Such a contention is resolved very fast by the circuit because the PMOS in leaky off is very weak. In traditional level converting circuits, there is contention between a fully on NMOS with VGS=VDDL and a fully on PMOS with |VGS|=VDDH. Such contention between fully on devices is slower to resolve and consumes more power than the contention illustrated in FIG. 2.

In FIG. 2, in some embodiments, the threshold voltage of the PMOS device is more than VDDH-VDDL and the PMOS is truly off, causing only a minimal leakage current through the transistors. In other cases, the threshold voltage of the PMOS can be slightly more than VDDH-VDDL, thus causing a higher leakage current through the transistors. In both cases, the leakage current of the PMOS is much less than the ON current that would be produced by having the same device fully on with |VGS|=VDDH. Consequently, the contention between the fully on NMOS and the leaky off PMOS is resolved very fast, with minimal power consumption. A circuit that has the worst case transient contention like the one illustrated in FIG. 2 may be considered to be "contention-free". Moreover, because the ratio between the current of the NMOS in the on state and the leakage current of the PMOS in the leaky off state is very large, the devices in FIG. 2 can have almost any ratio of sizes (hence any ratio of driving strengths when fully on) and the contention will always resolve quickly to the desired outcome (fully on NMOS overpowering the leaky-off PMOS). Therefore, a circuit that has the worst case transient contention like the one illustrated in FIG. 2 may be considered to be "non-ratioed". In contrast, in traditional level converting circuits, where there is contention between a fully on NMOS with VGS=VDDL and a fully on PMOS with |VGS|=VDDH, the ratio of the sizes of the two devices must be very carefully chosen such that the contention resolves to the desired outcome across all process corners. Thus, the "non-ratioed" property of the designs makes the circuits very robust to process variations.

In some embodiments, VDDL to VDDH conversion may be incorporated into a circuit design that is non-ratioed and contention-free. The design is considered contention-free when, even for the worst-case scenario, the contention is not worse than depicted in FIG. 2.

Figure 3:
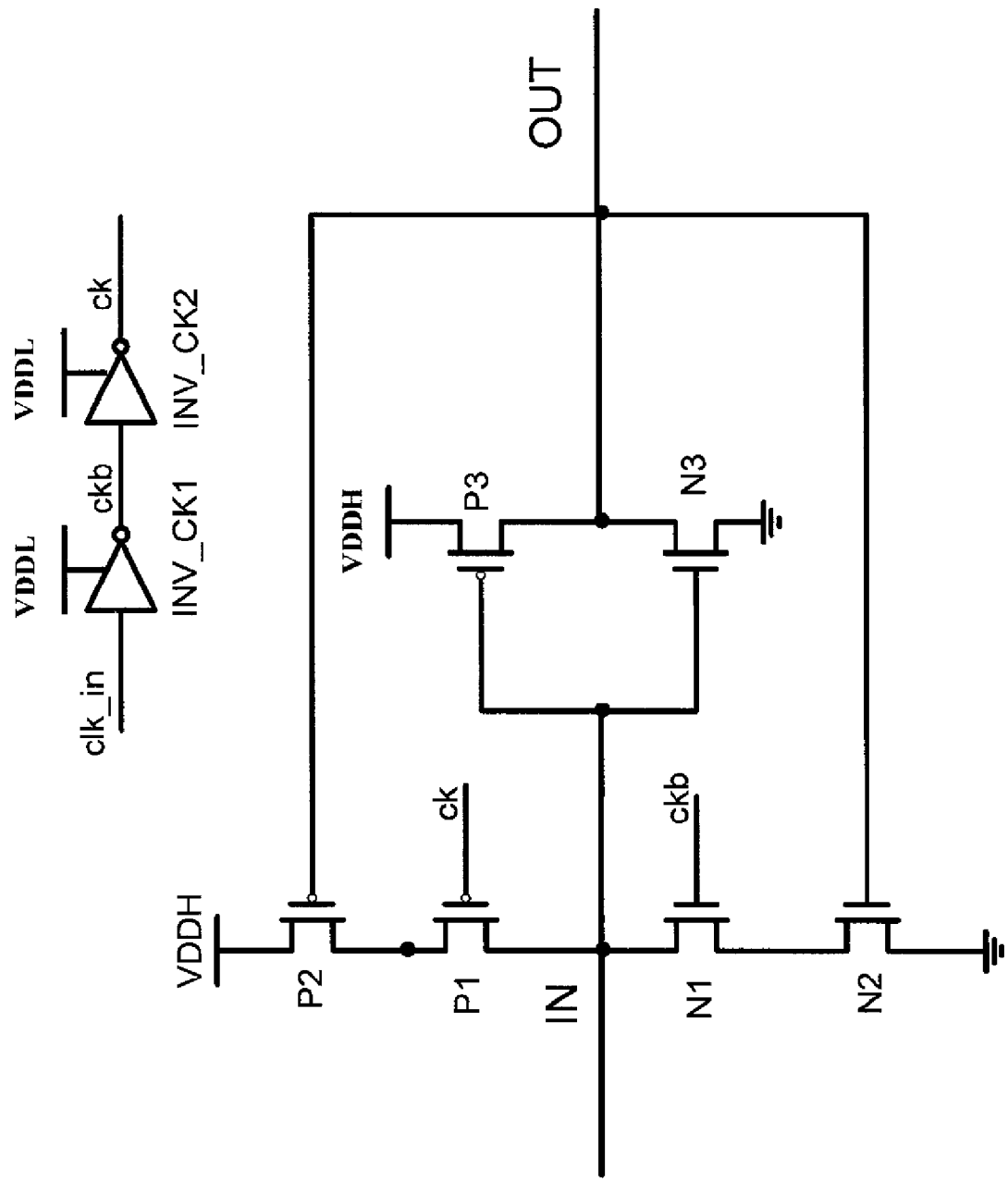
FIG. 3 illustrates a diagram showing a level-converting latch with low swing clock according to an embodiment of the invention.

FIG. 3 shows the schematic of a level converting latch with low swing clocking alone. This latch uses the same schematic as the classical single supply latch, but with the clock signal at VDDL. The internal clock buffers are also at VDDL. The buffers may include an inverter INV_CK1 to invert the input clock clk_in to provide ckb and another inverter INV_CK2 to invert ckb to provide the clock signal ck at VDDL. These clock buffers and inverters also may be used for the level-converting circuit designs in FIGS. 4-7.

The latch of FIG. 3 includes PMOS P1, P2 and P3, and NMOS N1, N2, and N3. This latch has an IN and an OUT. The latch includes P2 connected with VDDH and P1. P1 connected with P2 and IN. N1 connects IN and N2. N2 connects N1 and ground. The gate of P2 and N2 are connected to OUT, the gate of P1 is connected to ck and the gate of N1 is connected to ckb. P3 connects VDDH and OUT. N3 connects OUT and ground. The gate of N3 and P3 are connected to IN.

A problematic connection in this latch is ck-to-gate of P1: a VDDL signal (ck) connected to a VDDH PMOS (P1) has the potential to cause a significant leakage current. On closer inspection, such leakage is not possible after all transients are over: P1 can leak only if IN=0; but if IN=0, then OUT=1 and P2 is off (solidly off, with |VGS|=0), cutting off any leakage from P1. This design has a slight contention between P1 and the NMOS devices in the gate driving the input: when ck=1 (VDDL) and IN switches 1 to 0, until the positive feedback loop closes and P2 turns off, P1 is in leaky off and in contention with the fully on NMOS devices in the gate driving node IN. This contention between a fully on NMOS and a leaky off PMOS is illustrated in FIG. 2.

Figure 4:
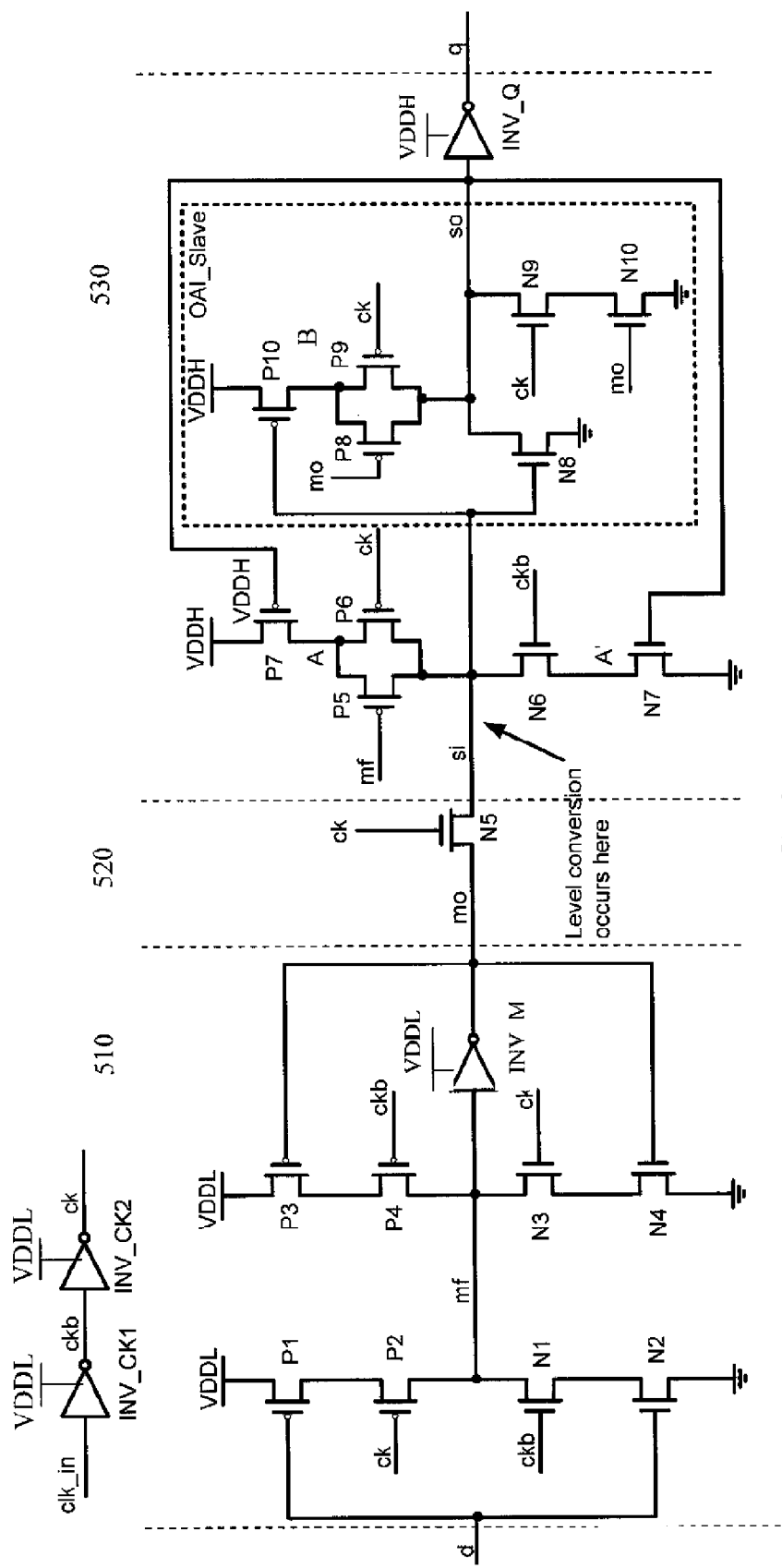
FIG. 4 illustrates a diagram showing a contention-free, non-ratioed double level-converting D flip-flop according to another embodiment of the invention.

In one embodiment, the principle from FIG. 3 may be applied to design a contention-free non-ratioed double level converting D flip-flop. FIG. 4 illustrates a diagram showing a logic circuit that is contention-free, non-ratioed double level converting D flip-flop using the design strategy of FIG. 3.

The logic circuit of FIG. 4 includes a VDDL master latch 510, a pass gate driven by a VDDL signal ck 520, and a VDDH slave latch 530. Many different designs are possible for the VDDL master latch 510. The pass gate N5 is a VDDL PMOS. The VDDH slave latch may be any design that is similar to the design of slave latch 530.

In one embodiment, the master latch 510 includes PMOS P1, P2, P3 and P4, NMOS N1, N2, N3, and N4 and inverter INV_M. P1 is connected to VDDL and P2. P2 is connected to P1 and node mf. N1 is connected to node mf and N2. N2 is connected to N1 and ground. P3 is connected to VDDL and P4. P4 is connected to P3 and node mf. N3 is connected to node mf and N4. N4 is connected to N3 and ground. INV_M is connected to node mf and node mo, which take signal mf and provides mo. Signal d is provided to the gates of P1 and N2. Clock signal ck is provided to the gates of N3 and P2. Clock signal ckb is provided to the gates of P4 and N1. The output of INV_M (node mo) is connected to the gate of P3 and N4.

In one embodiment, the pass gate N5 520 connects with mo and si and ck is provided at the gate of N5. In this type of level conversion flip-flops, level conversion occurs at node si.

In one embodiment, the slave latch 530 include PMOS, P5, P6, P7, P8, P9 and P10, NMOS N6, N7, N8, N9, N10, and INV_Q. P7 is connected to VDDH and node A. P5 and P6 are connected to node A and node si. N6 is connected to node si and node A'. N7 is connected to A' and ground. P10 is connected to VDDH and node B. P9 and P8 are connected to node B and Node so. N8 is connected to node so and ground. N9 is connected to node so and N10. N10 is connected to N9 and ground. P8, P9, P10, N8, N9, and N10 are configured as the OAI_Slave. INV_Q is connected to node so and q. Node so is connected to the gates of P7 and N7. Node si is connected to the gates of P10 and N8. Signal mf is provided to the gate of P5. Signal ckb is provided to N6. Signal ck is provided to P6, P9 and N9. Signal mo provided to P8 and N10.

Without P5 and P6, contention between N5 and P7 occurs when mo=0 and ck=1, but P7 is needed for level restoration at node si only when mo=1 and ck=1. Since P7 is needed in the circuit only when mo=1 (VDDL), P5 is inserted in the circuit driven by the complement of mo. Node mf provides this signal very conveniently and with the right timing to avoid contention: mf will switch to 1 (VDDL) before mo switches to 0. P6 closes the feedback loop in the slave latch when ck=0 and N5 is off. Due to the same reasons as in FIG. 4, P5 and P6 may not leak after all the transients are over despite having VDDL on their gates.

Without P8 and P9, the contention between P10 and N9, N10 occurs because N8, N9, N10 and P10 do not form a complementary CMOS gate. In FIG. 4, PMOS P8 and PMOS P9 are added, such that N8, N9, N10 and P8, P9, P10 form a static CMOS or-and-invert gate with the function so=(si+ck*mo)'. P8 and P9 are VDDH PMOS devices driven by VDDL signals (ck and mo). However, they will not leak after all transients are over: for P8 or P9 to leak, node so must be 0, which may be caused by si=1; therefore, P10 is off with |VGS|=0 and P8 and P9 do not leak.

The worst case contention in the level converting flip-flop from FIG. 4 is identical to FIG. 2, between fully on NMOS devices with VGS=VDDL and a leaky off PMOS with |VGS|=VDDH-VDDL, thus the design is contention-free and non-ratioed.

Figure 5:
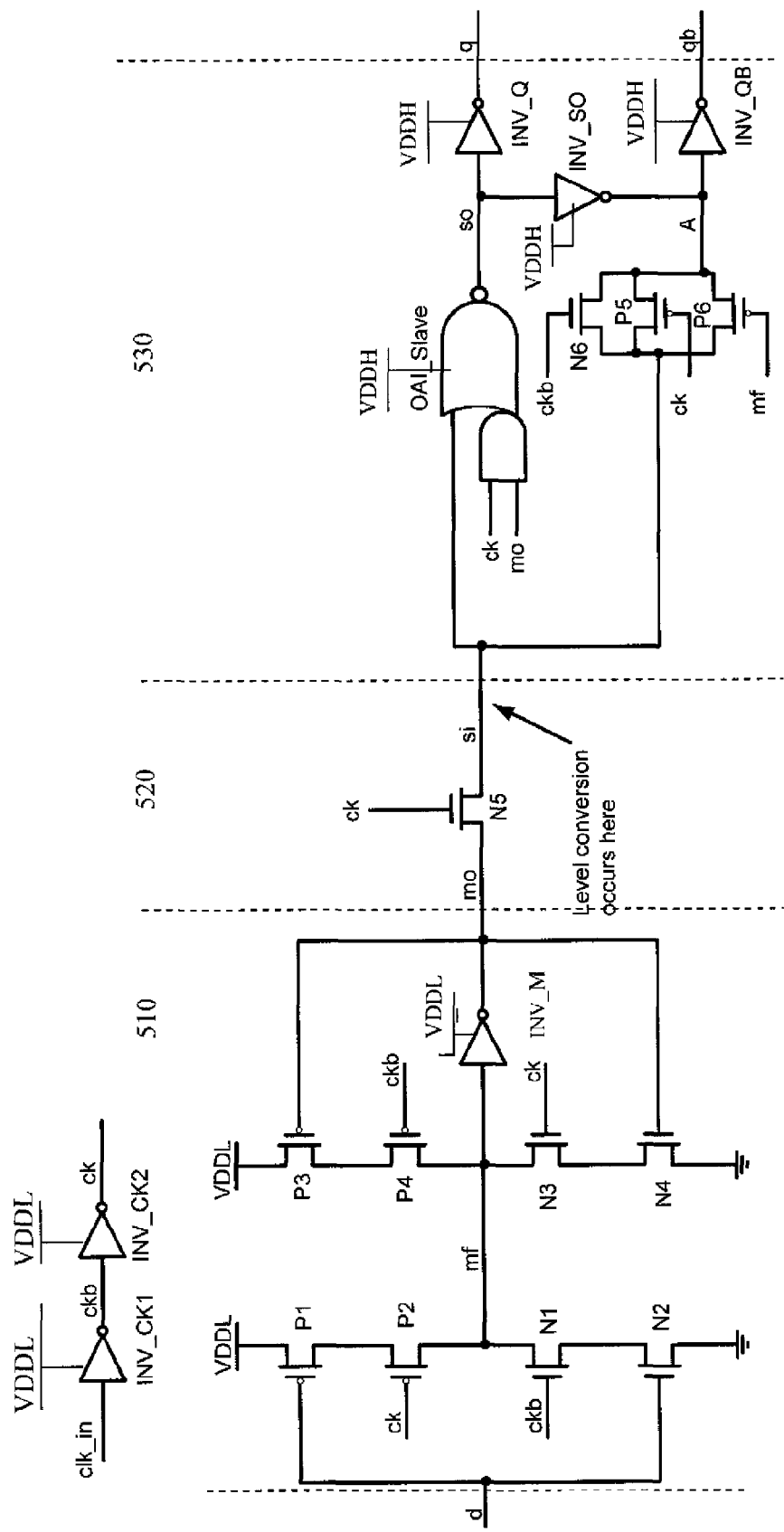
FIG. 5 illustrates a diagram showing a contention free non-ratioed double level-converting flip-flop with two complementary outputs according to another embodiment of the invention.

Other flip-flop designs can be created using the same technique and design strategy from FIG. 3. FIG. 5 is a diagram of a contention-free non-ratioed double level-converting flip-flop with two outputs. This diagram shows the two-output (Q and QB) version of the double level converting D flip-flop.

The correct contention-free and non-ratioed operation of this level-converting flip-flop can be demonstrated from FIG. 4. The circuit in FIG. 5 is the same as in FIG. 4 with nodes A and A' shorted, transistors P7 and N7 grouped together and labeled as INV_SO and the additional inverter INV_QB from A to QB. Shorting A and A' of FIG. 5 will not cause any strong contention or leakage.

Figure 6:
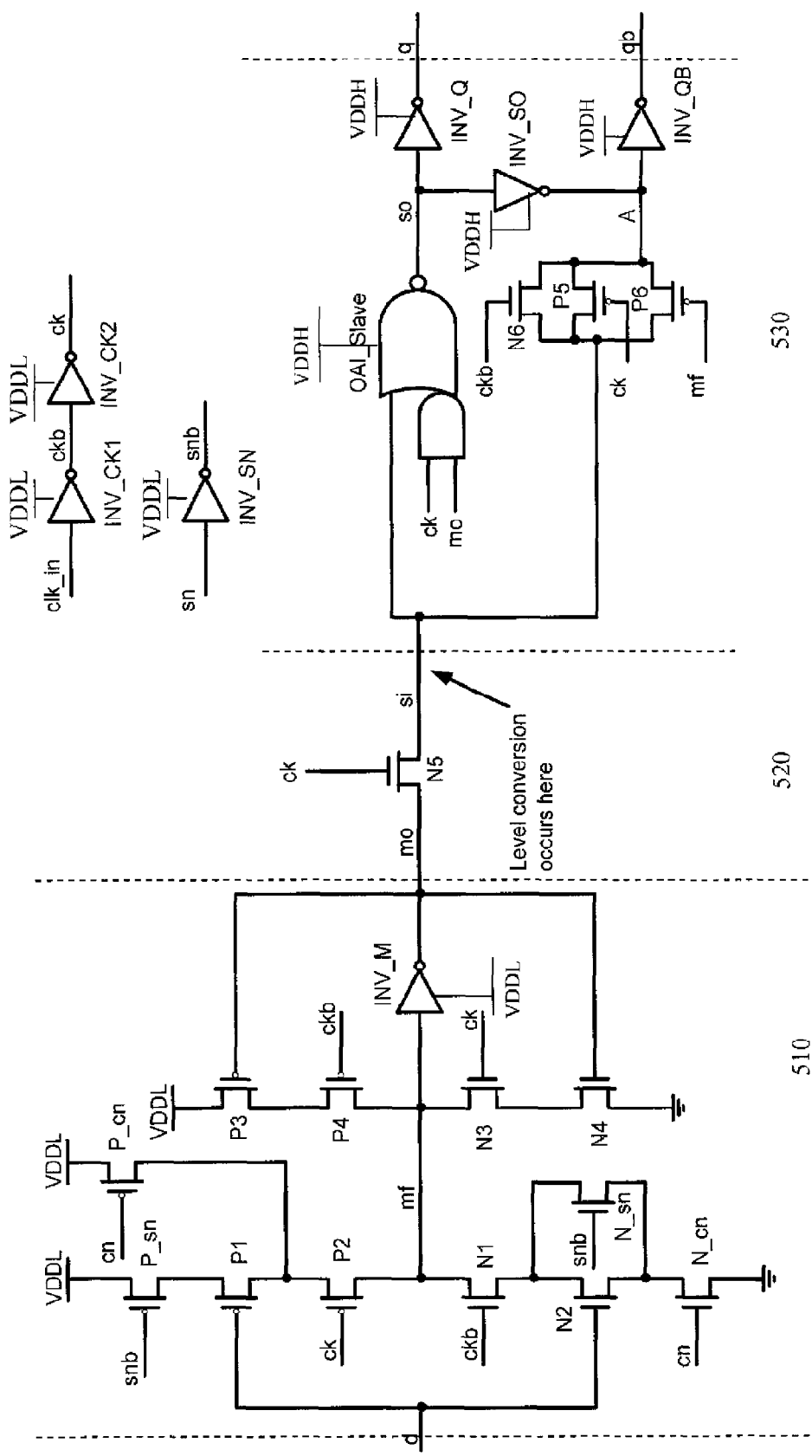
FIG. 6 illustrates a diagram showing a contention-free, non-ratioed level-converting flip-flop with synchronous set and clear according to an embodiment of the invention.

In other embodiments, level-converting flip-flops with synchronous inputs may be designed by changing the VDDL master latch. FIG. 6 is a diagram of a contention-free, non-ratioed level-converting flip-flop with synchronous set and clear, with D, CK, SN and CN at VDDL.

Figure 7:
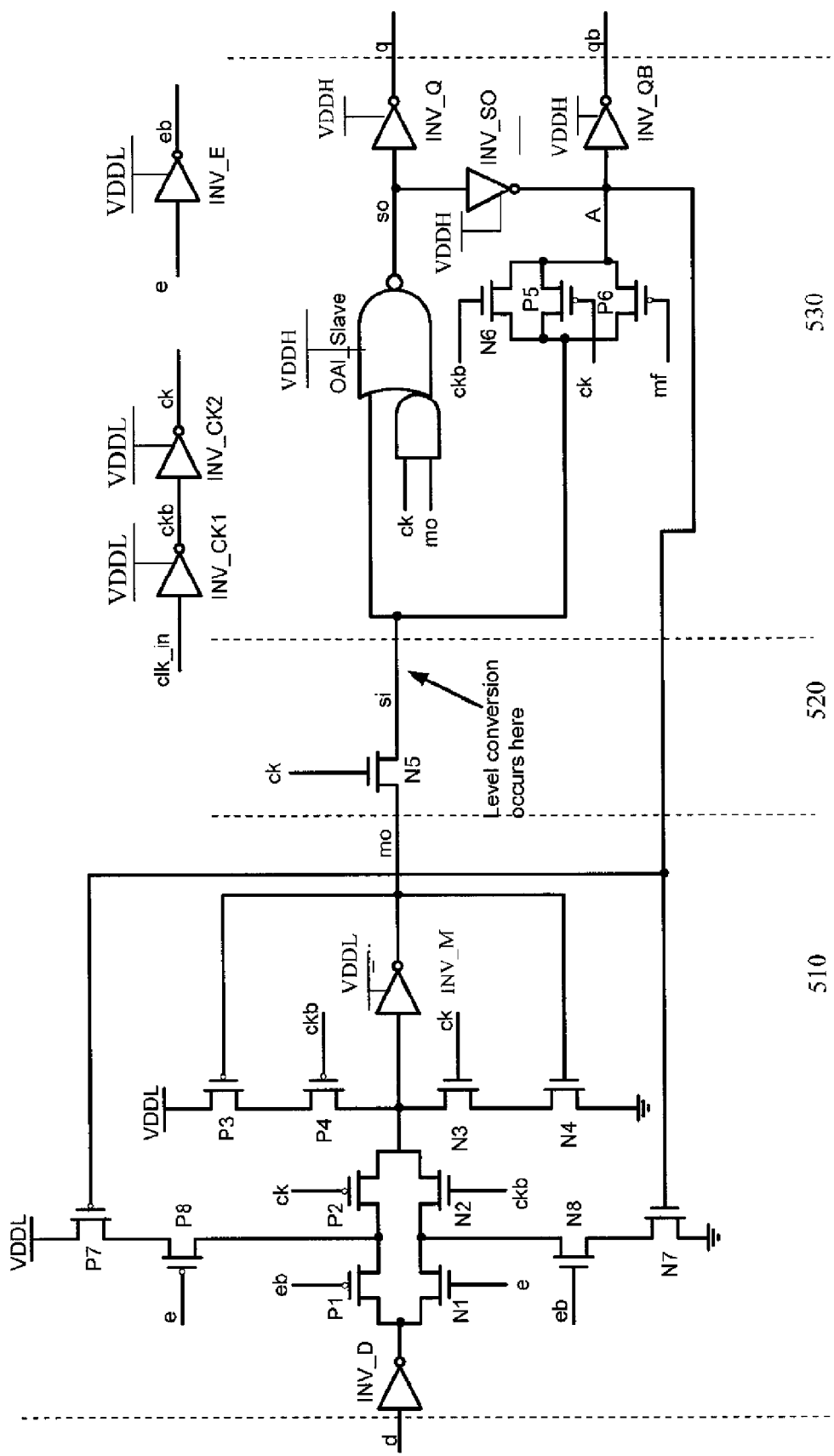
FIG. 7 illustrates a diagram showing a contention-free, non-ratioed level-converting flip-flop with synchronous enable according to an embodiment of the invention.

FIG. 7 is a diagram of a contention-free, non-ratioed level converting flip-flop with synchronous enable, with D, CK, and E at VDDL. This diagram shows a level-converting flip-flop with synchronous enable signal at VDDL level, which allows this flip-flop to be used with low swing clocking schemes where clock gating is also done at VDDL.

In other embodiments, scan-enabled, multiplexed inputs and other combinations of synchronous enable/set/reset level converting flip-flops may also be modified as well. In other words, all synchronous inputs can be at VDDL. In other embodiments, flip-flops with asynchronous inputs (e.g. asynchronous set/reset) can also be constructed in a similar way with the asynchronous inputs being at VDDH and any synchronous input as well as D and CK remain at VDDL.

The level converters have the same robustness as static CMOS circuits—they perform their function correctly even with the transistors having very different driving strength due to process variations or simply due to poor design.

Figure 8:
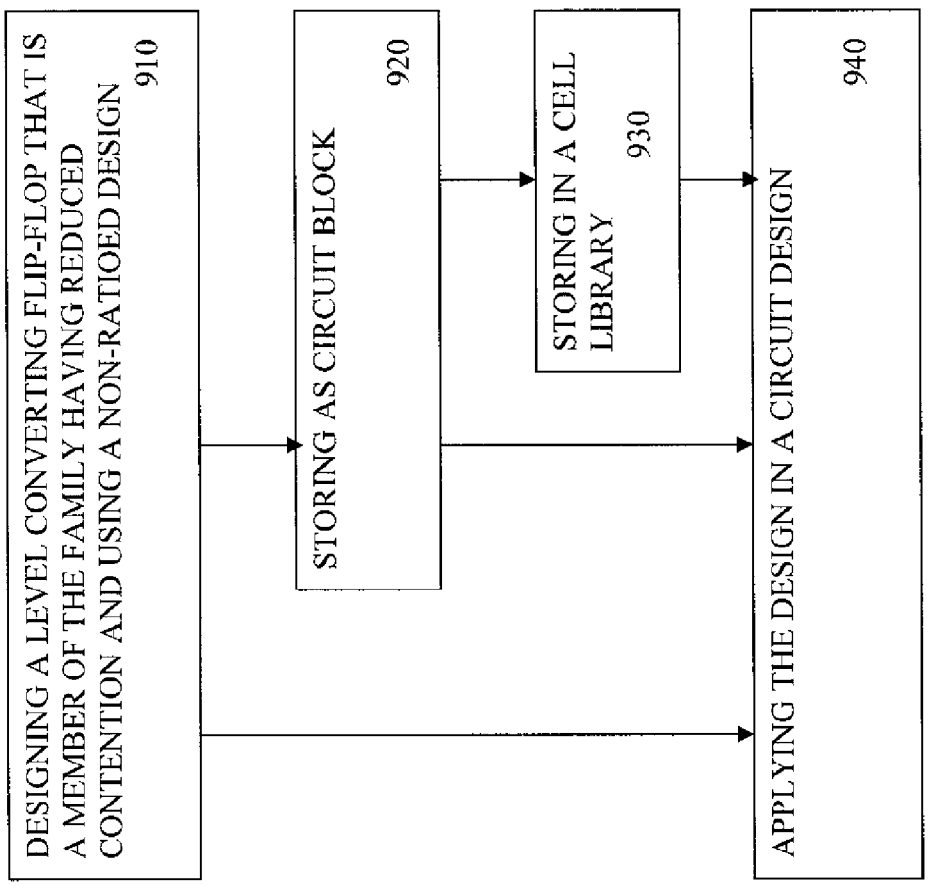
FIG. 8 depicts a flow diagram of a process for designing circuits having reduced contention and using a non-ratioed design according to an embodiment of the invention.

FIG. 8 depicts a flow diagram 900 of a process for designing circuits having reduced contention and using a non-ratioed design according to an embodiment of the invention. In an integrated circuit (IC) design, in some embodiments, a member of a family of level converting flip-flop is designed. It may be part of the IC design. It may be stored as a circuit block for repeated use in the IC design. It may be advantageous to have standardized cell designs accessible to the designers. In further embodiments, the circuit block may be stored as a standardized cell where designers with access/permission may use it in their design.

At 910, a level converting flip-flop that is a member of the family of circuits having reduced contention and a non-ratioed design is designed. The level converting flip-flop may be designed using any tools that are available to a designer. It is designed so that it has the desirable properties of being a non-ratioed and contention free design using strategies based on the descriptions above. In some embodiments, the level converting flip-flop may be designed from scratch. In other embodiments, an existing level-converting flip-flip design is used as a starting point. Locations of contentions are identified between transistors such as NMOS and PMOS. Contentions between the transistors are removed by the lessons taught in the FIGS. 4 to 7. As such, the worst case contention is as shown in FIG. 2. At 940, the design of this type of flip-flop may then be incorporated into a circuit design/project as desired.

The circuit blocks may be designed in a number of possible ways. For example, at 920, the flip-flop design may be stored as a circuit block for later reuse. In some embodiments, it is saved as a standardized cell block which may be stored in a cell library for easy access by users to incorporate in their design (930). In other embodiments, the block may be directly provided to a user to apply to the circuit design (940).

At 930, the designed blocks are stored in a cell library. The cell library may use any kind of schema and language. It may be located locally or at a central location. It may also be distributed at one or more remote locations. The cell library may be a computer-usable storage medium such as a repository or database of standardized cells of circuit design. Any form of medium as described in FIG. 9 may be used. The library may be accessed such that a user may incorporate the design block into the IC design. The library may be accessed via any type of connections such as a local bus, the Internet, a local area network, wireless network, etc. In some embodiments, security and/or encryption may be used to control access to the library information.

At 940, a circuit design incorporates the level converting flip flop that is a member of the family having reduced contention and using a non-ratioed design. In some embodiments, this level converting flip flop maybe be incorporated into a larger circuit design by importing from the cell library, as a circuit block, or directly designed as part of the circuit design.

The embodiments may be used for any type of design activities, including hardware design, software design, and designs including both hardware and software such as hardware/software co-design activities. For example, some embodiments of the invention may be applied to the design of embedded software and systems, which includes graphical processors, central processing units, computers, as well as any other systems that include embedded software.

Figure 9:
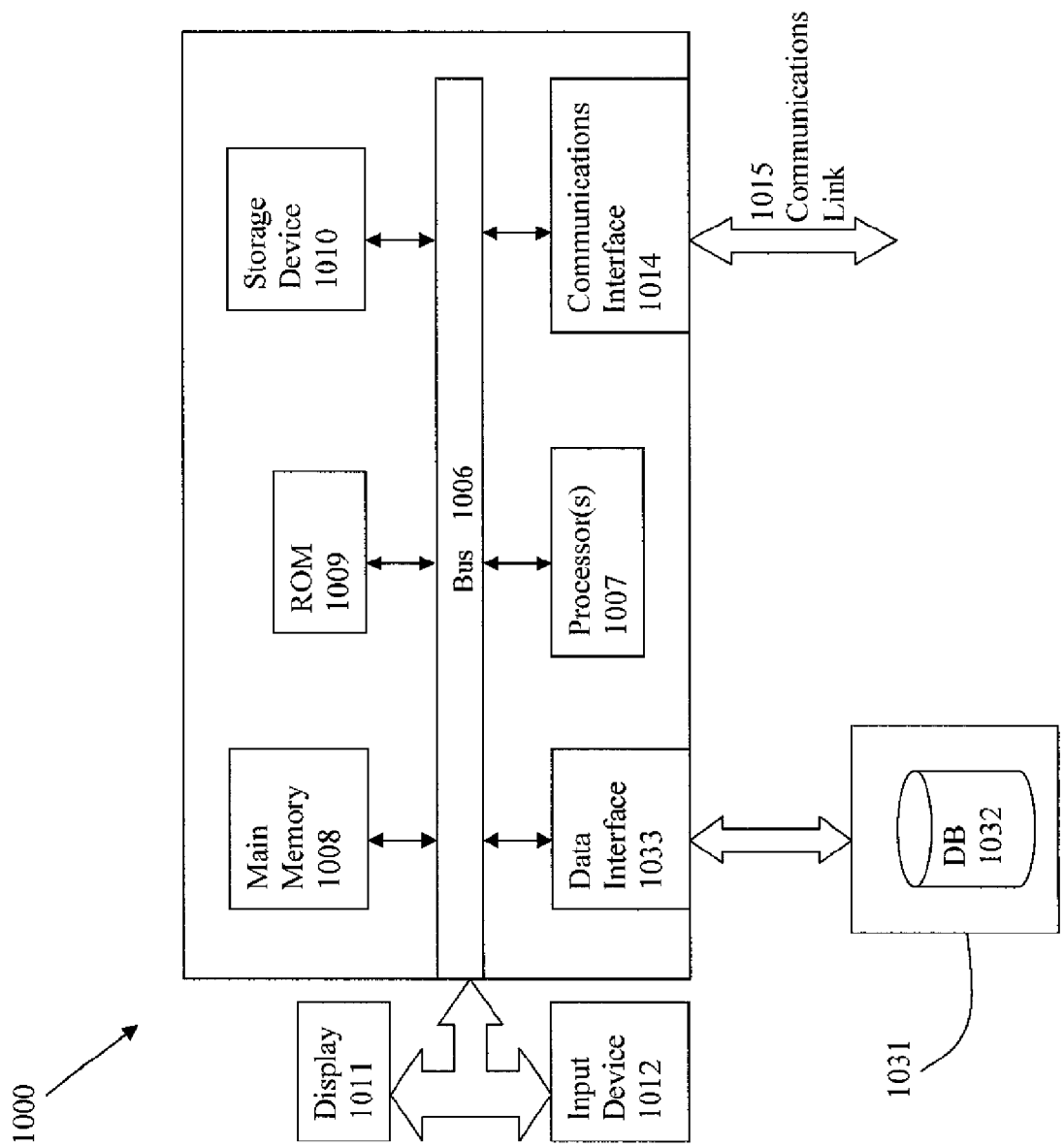
FIG. 9 depicts a computerized system on which a method for interfacing verification environment and the emulator can be implemented.

The execution of the sequences of instructions required to practice the embodiments may be performed by a computer system 1000 as shown in FIG. 9. In an embodiment, execution of the sequences of instructions is performed by a single computer system 1000. According to other embodiments, two or more computer systems 1000 coupled by a communication link 1015 may perform the sequence of instructions in coordination with one another. Although a description of only one computer system 1000 will be presented below, however, it should be understood that any number of computer systems 1000 may be employed to practice the embodiments.

FIG. 9 depicts a computerized system on which a method for implemented. The execution of the sequences of instructions required to practice the embodiments may be performed by a computer system 1000 as shown in FIG. 9. In an embodiment, execution of the sequences of instructions is performed by a single computer system 1000. According to other embodiments, two or more computer systems 1000 coupled by a communication link 1015 may perform the sequence of instructions in coordination with one another. Although a description of only one computer system 1000 will be presented below, however, it should be understood that any number of computer systems 1000 may be employed to practice the embodiments.

A computer system 1000 according to an embodiment will now be described with reference to FIG. 9, which is a block diagram of the functional components of a computer system 1000. As used herein, the term computer system 1000 is broadly used to describe any computing device that can store and independently run one or more programs.

The computer system 1000 includes a bus 1006 or other communication mechanism for communicating instructions, messages and data, collectively, information, and one or more processors 1007 coupled with the bus 1006 for processing information. Computer system 1000 also includes a main memory 1008, such as a random access memory (RAM) or other dynamic storage device, coupled to the bus 1006 for storing dynamic data and instructions to be executed by the processor(s) 1007. The main memory 1008 also may be used for storing temporary data, i.e., variables, or other intermediate information during execution of instructions by the processor(s) 1007.

The computer system 1000 may further include a read only memory (ROM) 1009 or other static storage device coupled to the bus 1006 for storing static data and instructions for the processor(s) 1007. A storage device 1010, such as a magnetic disk or optical disk, may also be provided and coupled to the bus 1006 for storing data and instructions for the processor(s) 1007.

The computer system 1000 may be coupled via the bus 1006 to a display device 1011, such as, but not limited to, a cathode ray tube (CRT), for displaying information to a user. An input device 1012, e.g., alphanumeric and other keys, is coupled to the bus 1006 for communicating information and command selections to the processor(s) 1007.

Each computer system 1000 may include a communication interface 1014 coupled to the bus 1006. The communication interface 1014 provides two-way communication between computer systems 1000. The communication interface 1014 of a respective computer system 1000 transmits and receives electrical, electromagnetic or optical signals, which include data streams representing various types of signal information, e.g., instructions, messages and data. A communication link 1015 links one computer system 1000 with another computer system 1000. For example, the communication link 1015 may be a LAN, in which case the communication interface 1014 may be a LAN card, or the communication link 1015 may be a PSTN, in which case the communication interface 1014 may be an integrated services digital network (ISDN) card or a modem, or the communication link 1015 may be the Internet, in which case the communication interface 1014 may be a dial-up, cable or wireless modem.

A computer system 1000 may transmit and receive messages, data, and instructions, including program (i.e., application or code) through its respective communication link 1015 and communication interface 1014. Received program code may be executed by the respective processor(s) 1007 as it is received, and/or stored in the storage device 1010, or other associated non-volatile media, for later execution.

In an embodiment, the computer system 1000 operates in conjunction with a data storage system 1031, e.g., a data storage system 1031 that contains a database 1032 that is readily accessible by the computer system 1000. The computer system 1000 communicates with the data storage system 1031 through a data interface 1033. A data interface 1033, which is coupled to the bus 1006, transmits and receives electrical, electromagnetic or optical signals that include data streams representing various types of signal information, e.g., instructions, messages and data. In other embodiments, the functions of the data interface 1033 may be performed by the communication interface 1014.

According to one embodiment, an individual computer system 1000 performs specific operations by their respective processor(s) 1007 executing one or more sequences of one or more instructions contained in the main memory 1008. Such instructions may be read into the main memory 1008 from another computer-usable medium, such as the ROM 1009 or the storage device 1010. Execution of the sequences of instructions contained in the main memory 1008 causes the processor(s) 1007 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1007. Such a medium may take many forms, including, but not limited to, non-volatile and volatile. Non-volatile media, i.e., media that can retain information in the absence of power, includes the ROM 1009, CD ROM, magnetic tape, and magnetic discs. Volatile media, i.e., media that cannot retain information in the absence of power, includes the main memory 1008.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A level converting flip-flop for low swing-clocking comprising:
    a slave latch comprising a first device and a second device, wherein
        the first device coupled to the second device and the second device are contention-free when the second device is in an on state and the first device is in a leaky off state;
    a level conversion circuitry, including a feedback loop that is shared between storage function and level-conversion function of the level converting flip-flop, to convert an output prior to transmission to the slave latch; and
    a master latch to generate the output and communicate with the slave latch, wherein the level converting flip-flop is non-ratioed.

2. The flip-flop of claim 1, wherein the level conversion circuitry is situated between and operatively coupled to both the master latch and the slave latch.

3. The flip-flop of claim 2, wherein contention-free is characterized by having no contention between fully on transistors.

4. The flip-flop of claim 1, wherein the flip-flop performs the function of level-conversion.

5. The flip-flop of claim 1, wherein the flip-flop performs the function of data storage.

6. The flip-flop of claim 1, wherein the flip-flop is used to build digital circuits that use low-swing clocking and clustered voltage scaling to reduce power.

7. A computer program product embodied on a non-transitory, tangible computer usable medium, the computer usable medium having stored thereon a sequence of instructions which, when executed by a processor, causes the processor to execute a process for designing a circuit that contains at least one level-converting flip-flop, the process comprising:
    providing, to a level converting flip-flop, at least a data signal and a clock signal at a first swing voltage, wherein the the level converting flip-flow includes a first device and a second device coupled to the first device;
    performing, by using a processor, level conversion for an output signal of a master latch prior to transmitting a converted output signal to a slave latch and storage of the converted output signal by using at least a level conversion circuitry of the level converting flip-flop, wherein
        the first device and the second device are contention-free when the second device is in an on state and the first device is in a leaky off state;
    sharing a feedback loop of the level conversion circuitry between storage function and level-conversion function of the level converting flip-flop; and
    outputting from the level converting flip-flop at least one output signal, wherein the output signal is at a second swing voltage.

8. The product of claim 7, wherein the first device is a P-type transistor and the second device is an N-type transistor.

9. The product of claim 8, wherein contention-free is characterized by having no contention between fully on transistors.

10. The product of claim 7, wherein the block performs the function of level-conversion.

11. The product of claim 7, wherein the block performs the function of data storage.

12. The product of claim 7, wherein the block is used to build digital circuits that use low-swing clocking and clustered voltage scaling to reduce power.

13. A method for synthesizing a circuit design that includes at least one level-converting flip-flop, comprising:
    providing to a level converting flip-flop at least a data signal and a clock signal at a first swing voltage, wherein the level converting flip-flop comprises a first device and a second device coupled to the first device;
    performing, by using a processor, level conversion for an output signal of a master latch prior to transmitting a converted output signal to a slave latch and storage of the converted output signal by using at least a level conversion circuitry of the level converting flip-flop, wherein
        the level-converting flip-flop is non-ratioed, and
        the first device and the second device are contention-free when the second device is in an on state and the first device is in a leaky off state;
    sharing a feedback loop of the level conversion circuitry between storage function and level-conversion function of the level converting flip-flop; and
    outputting from the level converting flip-flop at least one output signal, wherein the output signal is at a second swing voltage.

14. The method of claim 13, wherein the first device is a P-type transistor and the second device is an N-type transistor.

15. The method of claim 14, wherein contention-free is characterized by having no contention between fully on transistors.

16. The method of claim 13, wherein the first swing voltage is a lower voltage than the second swing voltage.

17. The method of claim 13, further comprising using low-swing clocking and clustered voltage scaling to build digital circuits.

18. The method of claim 13, further comprising storing design data having the circuit design in a volatile or non-volatile computer usable medium.

19. The flip-flop of claim 1, in which the flip-flop accepts input data and clock at a lower voltage level while producing output data at a higher voltage level.

20. The flip-flop of claim 1, in which the first device is a P-type transistor and the second device is an N-type transistor.

21. The flip-flop of claim 1, in which a transient contention exists between the first and second devices even when the first device couple to the second device is contention-free.

22. The product of claim 7, in which a transient contention exists between the first and second devices even when the first device couple to the second device is contention-free.

23. The method of claim 13, in which a transient contention exists between the first and second devices even when the first device couple to the second device is contention-free.

* * * * *